United States Patent
Zhang et al.

(10) Patent No.: US 10,180,610 B2
(45) Date of Patent: Jan. 15, 2019

(54) THIN FILM TRANSISTOR ARRAY SUBSTRATE AND MANUFACTURING METHOD THEREOF, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Jiuzhan Zhang, Beijing (CN); Guolei Wang, Beijing (CN)

(73) Assignees: BOE Technology Group Co., Ltd., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 14/779,109

(22) PCT Filed: Oct. 15, 2014

(86) PCT No.: PCT/CN2014/088691
§ 371 (c)(1),
(2) Date: Sep. 22, 2015

(87) PCT Pub. No.: WO2016/015383
PCT Pub. Date: Feb. 4, 2016

(65) Prior Publication Data
US 2016/0291436 A1    Oct. 6, 2016

(30) Foreign Application Priority Data

Jul. 28, 2014    (CN) .......................... 2014 1 0364401

(51) Int. Cl.
*H01L 29/08*    (2006.01)
*H01L 35/24*    (2006.01)
(Continued)

(52) U.S. Cl.
CPC ...... *G02F 1/136286* (2013.01); *G02F 1/1368* (2013.01); *G02F 1/133345* (2013.01);
(Continued)

(58) Field of Classification Search
CPC ....... H01L 21/77; H01L 27/12; H01L 27/124; H01L 27/1288
(Continued)

(56) References Cited

U.S. PATENT DOCUMENTS 7,385,661 B2    6/2008    Chae
8,853,028 B2    10/2014    Jang et al.
(Continued)

FOREIGN PATENT DOCUMENTS

CN    1573485 A    2/2005
CN    101206358 A    6/2008
(Continued)

OTHER PUBLICATIONS

Chinese Office Action in Chinese Application No. 201410364401.5 dated Jun. 28, 2016 with English translation.
(Continued)

*Primary Examiner* — Duy T Nguyen
(74) *Attorney, Agent, or Firm* — Collard & Roe, P.C.

(57) ABSTRACT

An array substrate and a manufacturing method thereof, and a display device are provided. The array substrate includes a base substrate (200), gate lines (210), data lines (220), a common electrode layer (25), a plurality of pixels formed by intersecting the gate lines (210) and the data lines (220) formed on the base substrate (200), and an organic film insulation layer (260) located between the common electrode layer (250) and a layer on which the data lines (220) are located. Each of the pixels includes a light transmission area and a light shielding area, in a pattern of the organic film insulation layer (260), no organic film insulation mate-
(Continued)

rial exists in the light transmission area, but the organic film insulation material at least remains in areas corresponding to the data lines (220). With the array substrate, the transmission of the display device is improved without influencing the display quality.

9 Claims, 3 Drawing Sheets

(51) Int. Cl.
  H01L 51/00    (2006.01)
  H01L 23/48    (2006.01)
  H01L 23/52    (2006.01)
  H01L 29/40    (2006.01)
  G02F 1/1362   (2006.01)
  G02F 1/1335   (2006.01)
  G02F 1/1343   (2006.01)
  G02F 1/1368   (2006.01)
  H01L 27/12    (2006.01)
  G02F 1/1333   (2006.01)
(52) U.S. Cl.
  CPC .. *G02F 1/133512* (2013.01); *G02F 1/134309* (2013.01); *H01L 27/124* (2013.01); *H01L 27/1248* (2013.01); *H01L 27/1288* (2013.01); G02F 1/133305 (2013.01); G02F 1/136209 (2013.01); G02F 2001/134318 (2013.01); G02F 2001/134372 (2013.01); G02F 2201/121 (2013.01); G02F 2201/123 (2013.01)

(58) Field of Classification Search
  USPC .................................................... 257/40, 776
  See application file for complete search history.

(56) References Cited

U.S. PATENT DOCUMENTS

| 2009/0057671 | A1* | 3/2009 | Ryu | G02F 1/133514 257/59 |
| 2009/0207362 | A1 | 8/2009 | Nagano et al. | |
| 2013/0222726 | A1 | 8/2013 | Choi et al. | |
| 2013/0256652 | A1* | 10/2013 | Lee | H01L 29/786 257/43 |

FOREIGN PATENT DOCUMENTS

| CN | 102116980 A | 7/2011 |
| CN | 103293804 A | 9/2013 |
| CN | 103558719 A | 2/2014 |

OTHER PUBLICATIONS

International Search Report of PCT/CN2014/088691 in Chinese, dated May 4, 2015 with English translation.
Notice of Transmittal of the International Search Report of PCT/CN2014/088691 in Chinese, dated May 4, 2015.
Written Opinion of the International Searching Authority of PCT/CN2014/088691 in Chinese, dated May 4, 2015 with English translation.
Second Chinese Office Action in Chinese Application No. 201410364401.5 dated Feb. 16, 2017 with English translation.

* cited by examiner

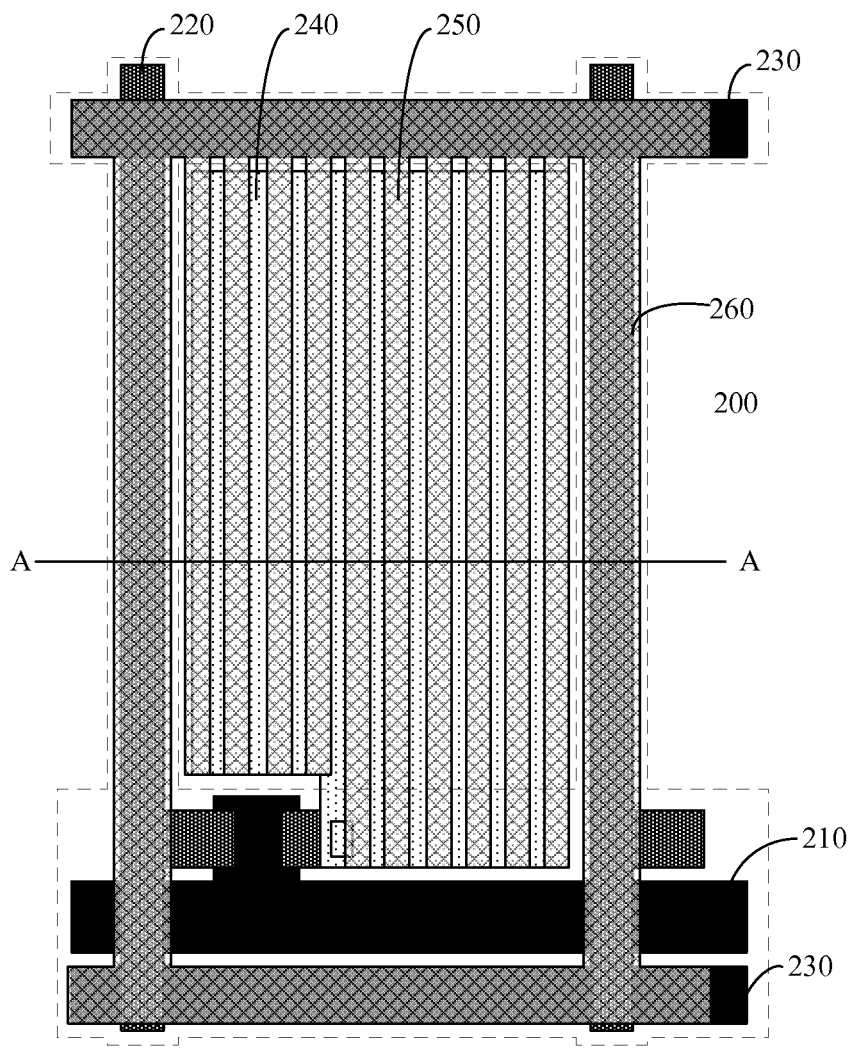
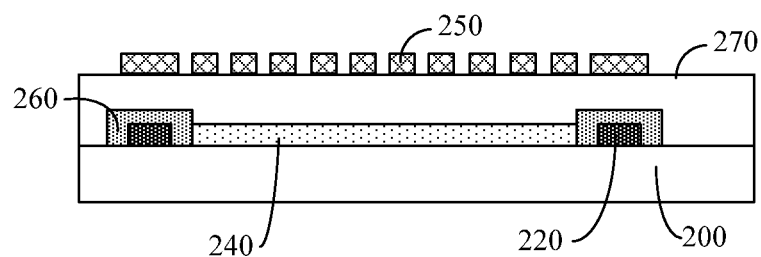
FIG.2a
FIG.2b

THIN FILM TRANSISTOR ARRAY SUBSTRATE AND MANUFACTURING METHOD THEREOF, AND DISPLAY DEVICE

CROSS REFERENCE TO RELATED APPLICATIONS

This application is the National Stage of PCT/CN2014/088691 filed on Oct. 15, 2014, which claims priority under 35 U.S.C. § 119 of Chinese Application No. 201410364401.5 filed on Jul. 28, 2014, the disclosure of which is incorporated by reference.

TECHNICAL FIELD

Embodiments of the present invention relate to an array substrate and a manufacturing method thereof, and a display device.

BACKGROUND

At present, the thin film transistor (TFT) display field is developed quickly, and the requirements for the development of the display include the characteristics such as slim profile, high resolution, high transmission, or the like. The display modes mainly include vertical alignment (VA), twist nematic (TN), advanced dimensional switch (ADS), high resolution ADS (HADS) or the like. The ADS and HADS modes are more favored by clients due to high aperture ratio and high transmission.

SUMMARY

At least one embodiment of the present invention provides an array substrate and a manufacturing method thereof, and a display device capable of improving the transmission of the display device without influencing display quality.

At least one embodiment of the present invention provides an array substrate, the array substrate comprises: a base substrate, gate lines, data lines, a common electrode layer, and a plurality of pixels formed by intersecting the gate lines and the data lines provided on the base substrate, and an organic film insulation layer located between the common electrode layer and the data lines; each of the pixel comprises a light transmission area and a light shielding area, and a pattern of the organic film insulation layer does not comprise the organic film insulation material in the light transmission area but comprises the organic film insulation material at least in areas corresponding to the data lines.

In at least one embodiment of the present invention, for example, the array substrate is further provided with a pixel electrode layer, an insulation separation layer is provided above the pixel electrode layer, and the common electrode layer is provided above the insulation separation layer.

In at least one embodiment of the present invention, for example, the organic film insulation layer is located between the insulation separation layer and the layer on which the data lines are provided.

In at least one embodiment of the present invention, for example, the organic film insulation layer fully covers the areas corresponding to the data lines.

At least one embodiment of the present invention further provides a display device comprising any one of the above described array substrates.

At least one embodiment of the present invention further provides a manufacturing method for an array substrate, the method comprises: forming a pattern comprising gate lines, data lines and a plurality of pixels formed by intersecting the gate lines and data lines on a base substrate, wherein each of the pixel comprises a light transmission area and a light shielding area; forming an organic film insulation layer and patterning the organic film insulation layer, so that no organic film insulation material exists in the light transmission area but the organic film insulation material is comprised in areas corresponding to the data lines; and forming a pattern comprising a common electrode layer above the organic film insulation layer.

In at least one embodiment of the present invention, for example, after forming the organic film insulation layer, the organic film insulation layer is exposed by a mask plate to remove the organic insulation material film in the light transmission area but comprise the organic insulation material film at least in the areas corresponding to the data lines.

In at least one embodiment of the present invention, for example, a buffer layer is formed, and the organic insulation layer is formed on the buffer layer, the organic insulation layer is exposed by a mask plate to remove the organic insulation material film in the light transmission area but comprise the organic insulation material film at least in the areas corresponding to the data lines, and the exposed buffer layer is etched in the light transmission area.

In at least one embodiment of the present invention, for example, the organic insulation layer is exposed by the mask plate, to remove the organic insulation layer in the light transmission area but comprise the organic insulation layer only in the areas corresponding to the data lines.

In at least one embodiment of the present invention, for example, a pixel electrode layer is formed above the organic film insulation layer, an insulation separation layer is formed above the pixel electrode layer, and the common electrode layer is formed above the insulation separation layer.

DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1b is a schematic cross sectional view taken along A-A in FIG. 1a;

FIG. 2a is a schematic view showing the structure of the array substrate according to an embodiment of the present invention; and FIG. 2b is a schematic cross sectional view taken along A-A in FIG. 2a.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1A:
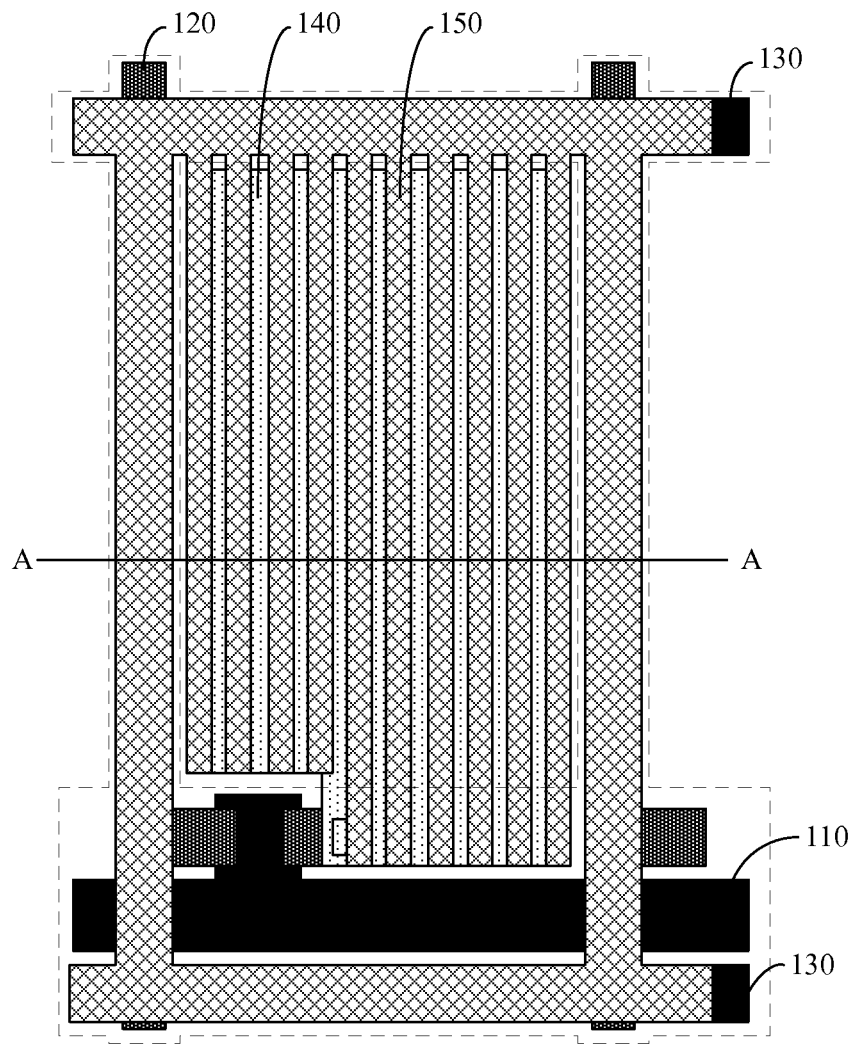
FIG. 1a is a schematic view showing the structure of an array substrate.
Figure 1B:
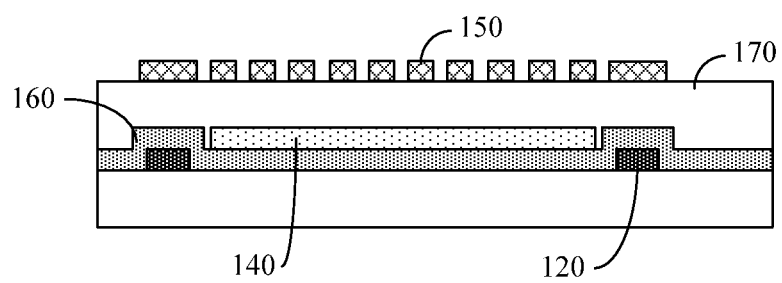

FIG. 1a and FIG. 1b are a schematic plan view of an ADS or HADS array substrate relating to the process of organic film technology and a schematic structural view taken along line A-A, respectively. The array substrate includes gate lines 110, data lines 120, common electrode lines 130, first electrodes (pixel electrodes) 140 and second electrodes (stripe-like common electrodes) 150, the first electrodes 140 and the second electrodes 150 are spaced by an insulation separation layer 170. The second electrodes 150 are connected with the common electrode lines 130 by vias (not shown). The gate lines 110 and the data lines 120 are intersected to define pixel units.

In the above ADS and HADS display mode, because the overlapped area between the wirings of the data lines 120 and the common electrodes 150 is relative large, the overlapping capacitance will be increased, resulting in an increased load on the data lines 120, and thus the quality of displayed picture is influenced. As shown in FIG. 1b, a layer of organic film insulation layer 160 is formed above the layer on which the data lines 120 are located.

The inventors of the present application has noted that in the structure as shown in FIG. 1a and FIG. 1b, the organic film are formed in whole effective light emitting areas surrounded by the black matrix (as shown in FIG. 1a, the chessboard shaped areas surrounded by dashed lines are black matrix covering areas, and the effective light emitting areas are enclosed by the chessboard shaped areas), and therefore backlight will suffer from loss when it pass therethrough. It has been illustrated by experiments that a single layer of the organic film with the thickness of 2 μm has a transmission of 96%, and thus the transmission is lowered down to a certain degree.

The array substrate according to at least one embodiment of the present invention includes a base substrate, and gate lines, data lines and a plurality of pixels formed by intersection of the gate lines and the data lines formed on the base substrate. Each of the pixels includes a light transmission area and a light shielding area. The light shielding area is the area unblocked by e.g., black matrix. The array substrate is provided with a common electrode layer thereon. In order to prevent influence on the display quality and to improve the transmission, the array substrate is further provided with an organic film insulation layer located between the common electrode layer and a layer on which the data lines are provided; in the pattern for the organic insulation layer, the organic film insulation material does not exist in the light transmission area but at least remains in areas corresponding to the data lines.

With the organic film insulation layer provided in the array substrate, the problem of large load on the data lines caused by the large overlapping area between the data lines and the common electrodes located thereabove is alleviated, the display quality is guaranteed, and by forming the organic film insulation layer on in the areas corresponding to the data lines, no organic film insulation layer exists in the light transmission areas of the pixels, and thus the transmission of the display device is improved.

In the embodiments described below, the structure of the array substrate will be described in detail with reference to ADS or HADS array substrate by way of example. FIG. 2a is a schematic view showing the structure of the array substrate according to an embodiment of the present invention, and FIG. 2b is a schematic cross sectional view taken along A-A in FIG. 2a.

As shown in FIG. 2a and FIG. 2b, the ADS or HADS array substrate according to one embodiment of the present invention includes: a base substrate 200; data lines, a common electrode layer 250, a pixel electrode layer 240 that are provided on the base substrate; and an insulation separation layer 270 provided between the common electrode layer 250 and the pixel electrode layer 240. That is, both the pixel electrode layer 240 and the data lines 220 are provided with the insulation separation layer 270 thereabove, and the common electrode layer 250 is provided above the insulation separation layer 270. The data lines 220 and the gate lines are intersected with each other to define pixels. In addition, common electrode lines 230 are provided parallel with the gate lines, 210, and are electrically connected with the common electrode layer 250 through e.g., vias.

Figure 2C:
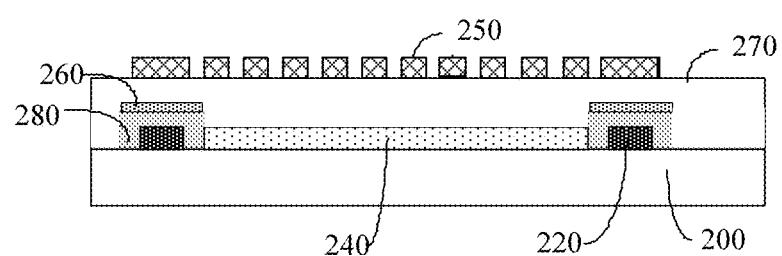
FIG. 2c is a schematic cross sectional view of another structure of the array substrate according to an embodiment of the present invention.

The array substrate further includes an organic film insulation layer 260 formed between the common electrode layer 250 and the data lines 220, the organic film insulation layer 260 is patterned so that the organic film insulation material does not exist in light transmission areas of the pixels but at least remains in areas corresponding to the data lines 220. In the present embodiment, in order to alleviate the influence on the electric field strength between the common electrodes 250 and the pixel electrodes 240 so that the liquid crystal molecules can be normally driven, for example, the organic film insulation layer 260 is directly overlapped on the data lines 220, that is, is located in the areas corresponding to the data lines 220 between the insulated spacing layer 270 and the data lines 220. As shown in FIG. 2c, a buffer layer 280 can be formed between the organic film insulation layer 260 and the data lines 220.

It is to be noted that the above figures only present the schematic views of the embodiment of the present invention, and is not intended to limit its scope. For example, the data lines 220 are not necessarily formed directly on the base substrate 200, and there may be other layer structures between them. The data lines 220 and the pixel electrode layer are not necessarily formed on the same layer, and they can be located on different layers.

For the array substrate on which no common electrode layer is formed, such as in a TN mode display device, a common electrode is often located on a color film substrate opposite to the array substrate, and in this case, it is only necessary that the organic film insulation layer is located on the base substrate above the corresponding data lines, for example, directly overlapped above the data lines.

Furthermore, in order to avoid the problem of large load on the data lines due to large overlapping area between the data line and the common electrodes thereabove as much as possible, the organic film insulation film fully covers from the above the areas corresponding to the data lines.

At least one embodiment of the present invention further provides a manufacturing method for an array substrate, including the following steps.

Firstly, forming a pattern including gate lines, data lines and a plurality of pixels formed by intersection between the gate lines and the data lines on the base substrate, each of the pixels including a light transmission area and a light shielding area.

Secondly, forming an organic film insulation layer, and patterning the organic film insulation layer so that no organic film insulation material exists in the light transmission area but the organic film insulation material at least remains in areas corresponding to the data lines.

Then, forming a pattern including a common electrode layer above the organic film insulation layer.

In at least one embodiment of the present invention, the organic film insulation layer is formed and patterned so that no organic film insulation material exists in the light transmission area but the organic film insulation material at least remains in the areas corresponding to the data lines can be specifically implemented in following examples.

Firstly, an organic insulation material film is formed to form the organic film insulation layer, and the organic insulation material may be a photosensitive organic insulation material, such as photoresist. The organic insulation material film is exposed by a mask plate to remove the organic insulation material film in the light transmission area but at least keep the organic insulation material film in the areas corresponding to the data lines.

In at least one embodiment of the present invention, the organic film insulation layer may be formed and patterned so that no organic film insulation material exists in the light transmission area but the organic film insulation material is at least left in the areas corresponding to the data lines in following specific example.

Figure 3A:
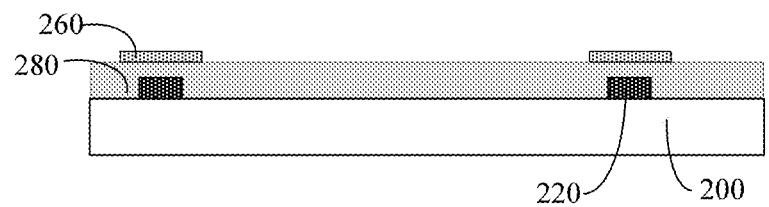
FIG. 3a is a schematic cross sectional view of the structure of array substrate before etching the exposed buffer layer.
Figure 3B:
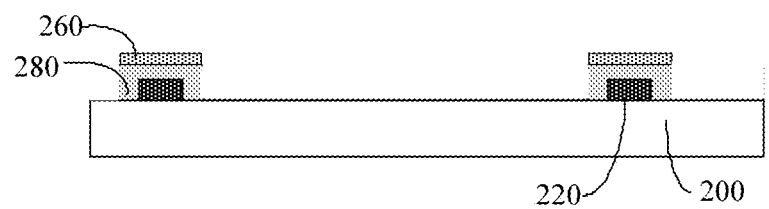
FIG. 3b is a schematic cross sectional view of the structure of array substrate after the exposed buffer layer being etched.

A buffer layer (such as: SiNx, i.e., silicon nitride) 280 is firstly formed (for example, formed on a base substrate 200 with data lines 220) as shown in FIG. 3a, then an organic insulation material film is formed on the buffer layer 280 to form the organic film insulation layer 260; subsequently, the organic insulation material film is exposed with a mask plate to remove the organic insulation material film in the light transmission area but at least keep the organic insulation material film in the areas corresponding to the data lines. Finally, for example, with reference to FIG. 3b, the exposed buffer layer 280 is etched in the light transmission area. Because channels of thin film transistors (TFT) have been formed when the organic film insulation layer is formed, the formed buffer layer can protect the channels of the thin film transistors from being contaminated by the organic insulation material, so as to maintain the characteristics of the TFT.

In at least one embodiment of the present invention, the process of exposing the organic insulation material film with the mask plate so as to remove the organic insulation material film in the light transmission area but at least keep the organic insulation material film in the areas corresponding to the data lines can be specifically implemented in the following example.

The organic insulation material film is exposed by the mask plate to remove the organic insulation material film in the light transmission area, and only the organic insulation material film in the areas corresponding to the data lines are remained That is, the organic film insulation layer will just fully cover the data lines.

In at least one embodiment of the present invention, the step of forming a pattern, including the common electrode layer above the organic film insulation layer, can be specifically implemented in the following example.

A pixel electrode layer is formed above the organic film insulation layer, an insulation separation layer is formed above the pixel electrode layer, and the common electrode layer is formed above the insulation separation layer.

At least one embodiment of the present invention further provides a display device including the array substrate as described in any one of the above embodiments. The display device may be a liquid crystal display panel, an electronic paper, a liquid crystal television, a liquid crystal display, a digital photo frame, a mobile phone, a table computer, a watch or any product or component having display function.

The present disclosure has been described above by way of the exemplary embodiment, and the protection scope of the present disclosure should not be limited thereto, and is only defined by the following claims.

The present application claims the priority of Chinese Patent Application No. 201410364401.5 filed on Jul. 28, 2014, the Chinese Patent Application is entirely incorporated therein by reference as a part of the present application.

What is claimed is:

1. An array substrate, comprising:
   a base substrate;
   gate lines, data lines, a common electrode layer, and a plurality of pixels formed by intersecting between the gate lines and the data lines formed on the base substrate; and
   an organic film insulation layer located between the common electrode layer and the base substrate on which the data lines are provided;
   wherein
   each of the pixels includes a light transmission area and a light shielding area;
   a pattern of the organic film insulation layer does not comprise organic film insulation material in the light transmission area but comprises the organic film insulation material at least in areas corresponding to the data lines;
   each of the data lines is a single-layer structure and comprises an upper surface and a lower surface which are opposite to each other;
   the upper surface of the each of the data lines, distanced from the base substrate by a thickness of the each of the data lines, is opposite to the lower surface of the each of the data lines; and
   the organic film insulation layer is in direct contact with the upper surface, and the base substrate is in direct contact with the lower surface;
   the array substrate further comprises a pixel electrode layer, wherein two side surfaces of the pixel electrode layer are in direct contact with the organic film insulation layer provided at opposite sides of the pixel electrode layer.

2. The array substrate according to claim 1, wherein the pixel electrode layer is provided with an insulation separation layer thereabove, and the common electrode layer is provided above the insulation separation layer.

3. The array substrate according to claim 2, wherein the organic film insulation layer is located between the insulation separation layer and the base substrate on which the data lines are provided.

4. The array substrate according to claim 3, wherein the organic film insulation layer fully covers the areas corresponding to the data lines.

5. The array substrate according to claim 2, wherein the organic film insulation layer fully covers the areas corresponding to the data lines.

6. The array substrate according to claim 1, wherein the organic film insulation layer fully covers the areas corresponding to the data lines.

7. A display device comprising the array substrate according to claim 1.

8. The array substrate according to claim 1, wherein
   only the data lines with the single-layer structure are provided between the organic film insulation layer and the base substrate in a direction perpendicular to the base substrate.

9. The array substrate according to claim 1, wherein
an orthographic projection of the organic film insulation layer and corresponding data lines on a first plane, which is perpendicular to the corresponding data line, is a rectangle.

* * * * *